United States Patent
Kitagawa et al.

(10) Patent No.: US 10,361,101 B2
(45) Date of Patent: Jul. 23, 2019

(54) SUBSTRATE CLEANING APPARATUS AND SUBSTRATE PROCESSING APPARATUS X

(71) Applicant: EBARA CORPORATION, Tokyo (JP)

(72) Inventors: Yoshitaka Kitagawa, Tokyo (JP); Hisajiro Nakano, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/715,847

(22) Filed: Sep. 26, 2017

(65) Prior Publication Data

US 2018/0090347 A1    Mar. 29, 2018

(30) Foreign Application Priority Data

Sep. 29, 2016 (JP) ................................. 2016-191945

(51) Int. Cl.
  *H01L 21/02*    (2006.01)
  *H01L 21/67*    (2006.01)
  *B08B 1/04*     (2006.01)
  *A46B 13/02*    (2006.01)

(52) U.S. Cl.
  CPC ........ *H01L 21/67092* (2013.01); *A46B 13/02* (2013.01); *B08B 1/04* (2013.01); *H01L 21/02096* (2013.01); *H01L 21/6704* (2013.01); *H01L 21/67046* (2013.01); *H01L 21/67219* (2013.01); *H01L 21/67253* (2013.01)

(58) Field of Classification Search
  CPC .... H01L 21/67; H01L 21/02; H01L 21/67092
  See application file for complete search history.

(56) References Cited

U.S. PATENT DOCUMENTS

| | | | | |
|---|---|---|---|---|
| 5,636,401 A | * | 6/1997 | Yonemizu | B08B 1/007 15/102 |
| 5,829,087 A | * | 11/1998 | Nishimura | H01L 21/67046 15/88.2 |
| 2002/0029431 A1 | * | 3/2002 | Oikawa | B08B 1/04 15/77 |
| 2014/0310895 A1 | * | 10/2014 | Chen | H02P 29/00 15/21.1 |
| 2015/0221531 A1 | * | 8/2015 | Tanaka | A46B 13/001 15/102 |
| 2016/0243592 A1 | * | 8/2016 | Tanaka | G01L 1/048 |

FOREIGN PATENT DOCUMENTS

| | | |
|---|---|---|
| JP | 2002-050602 A | 2/2002 |
| JP | 2014-038983 A | 2/2014 |
| JP | 2016-157778 A | 9/2016 |

* cited by examiner

Primary Examiner — Michael D Jennings
(74) Attorney, Agent, or Firm — Baker & Hostetler LLP

(57) ABSTRACT

A substrate cleaning apparatus for bringing an elongated roll cleaning member into sliding contact with a flat plate type substrate to perform cleaning processing on the substrate includes a roll holder for supporting the roll cleaning member so that the roll cleaning member is rotatable, an elevating mechanism that has a linking member for supporting the roll holder, and moves the roll holder up and down so that the roll cleaning member applies a predetermined roll load to the substrate, a sensor member that is provided to the linking member and measures frictional force between the roll cleaning member and the substrate, and a controller for performing feedback control on the frictional force between the roll cleaning member and the substrate based on a measured value of the sensor member.

8 Claims, 5 Drawing Sheets

SUBSTRATE CLEANING APPARATUS AND SUBSTRATE PROCESSING APPARATUS X

CROSS-REFERENCE TO RELATED APPLICATIONS

This application claims the benefit of Japanese Priority Patent Application JP 2016-191945 filed on Sep. 29, 2016, the entire contents of which are incorporated herein by reference.

FIELD OF THE INVENTION

The present invention relates to a substrate cleaning apparatus for scrub-cleaning the surface of a substrate such as a semiconductor wafer by using a roll-shaped cleaning member, and a substrate processing apparatus including the substrate cleaning apparatus.

BACKGROUND ART

There has been known a substrate cleaning apparatus for cleaning the surface of a substrate such as a wafer while a cylindrical roll cleaning member is pressed against the substrate. It is required in this type of substrate cleaning apparatus to press the roll cleaning member against the substrate under a fixed pressing load during cleaning of the substrate. However, it is impossible to grasp a load (hereinafter referred to as "roll load") being actually applied to the substrate due to variation in properties of the roll cleaning member, aging variation or the like when the substrate is cleaned by using the roll cleaning member.

Therefore, the applicant of the present application has developed a technique of measuring supply pressure of air to be supplied to an air cylinder for moving a roll cleaning member up and down and then performing feedback control on the roll load based on the measured value (Japanese Patent Laid-Open No. 2016-157778). Furthermore, according to a substrate cleaning apparatus described in Japanese Patent Laid-Open No. 2002-50602, a pressure sensor such as a load cell for measuring a roll load applied to a substrate from a roll cleaning member is installed in the apparatus, and feedback control is performed on the roll load based on the measured value.

Furthermore, according to a substrate cleaning apparatus described in Japanese Patent Laid-Open No. 2014-38983, a load cell for measuring a roll load is disposed between an elevating unit of an elevating mechanism for moving a roll cleaning member up and down and a roll holder for holding the roll cleaning member, and the elevating unit is driven based on a measured value in the load cell to feedback the roll load.

In a substrate cleaning apparatus of such a type that a roll cleaning member is pressed against a substrate or the like, the substrate is moved relatively to the roll cleaning member during cleaning of the substrate, so that frictional force occurs between the roll cleaning member and the substrate during the movement of the substrate. When the frictional force varies due to variation of pressing force of the roll cleaning member or variation of the state of the substrate surface, there is a risk that the cleaning performance of the roll cleaning member may be degraded. However, it has been difficult in the substrate processing apparatuses described in the foregoing patent literatures to remove influence of the frictional force between the roll cleaning member and the substrate on the cleaning performance.

The present invention has been implemented in view of the foregoing situation, and has an object to provide a substrate cleaning apparatus capable of controlling variation of the cleaning performance of the roll cleaning member by detecting the frictional force between the roll cleaning member and the substrate, and a substrate processing apparatus having the same.

SUMMARY OF THE INVENTION

According to an aspect of the present invention, a substrate cleaning apparatus for bringing an elongated roll cleaning member into sliding contact with a flat plate type substrate to perform cleaning processing on the substrate, comprises: a roll holder for supporting the roll cleaning member so that the roll cleaning member is rotatable; an elevating mechanism that has a linking member for supporting the roll holder, and moves the roll holder up and down so that the roll cleaning member applies a predetermined roll load to the substrate; a sensor member which is provided to the linking member and measures frictional force between the roll cleaning member and the substrate; and a controller for performing feedback control on the frictional force between the roll cleaning member and the substrate based on a measured value of the sensor member.

Torque caused by the frictional force between the roll cleaning member and the substrate which move relatively to each other during cleaning processing concentrates at the linking member for supporting the roll holder. Therefore, the frictional force between the roll cleaning member and the substrate can be effectively detected by providing the sensor member to the linking member, and deterioration of the cleaning characteristic caused by variation of the frictional force can be suppressed.

In the foregoing substrate cleaning apparatus, the sensor member is preferably disposed inside the linking member. This configuration makes it possible to more accurately detect the frictional force between the roll cleaning member and the substrate.

In the foregoing substrate cleaning apparatus, the sensor member may measure a roll load applied onto the substrate by the roll cleaning member, and the controller may control up-and-down movement of the roll holder based on the measured value of the roll load from the sensor member to feed back the roll load. This configuration makes it possible to suppress variation of the pressing force applied onto the substrate by the roll cleaning member, so that a load cell which has been used in a conventional substrate processing apparatus can be replaced by a sensor member.

In the foregoing substrate cleaning apparatus, the controller may calculate a friction coefficient between the roll cleaning member and the substrate based on the roll load and the frictional force which are measured by the sensor member, and detect abnormality of the roll cleaning member when the calculated friction coefficient deviates from a predetermined range. This configuration makes it possible to exchange a roll cleaning member in which abnormality occurs, and also prevent degradation of cleaning performance caused by abnormality of the roll cleaning member.

In the foregoing substrate cleaning apparatus, the linking member is preferably arranged substantially at the center along a longitudinal direction of the roll holder.

A substrate processing apparatus according to an aspect of the present invention has the foregoing substrate cleaning apparatus. This configuration makes it possible to suppress deterioration of the cleaning characteristic caused by variation of the frictional force between the roll cleaning member and the substrate during cleaning processing.

DETAILED DESCRIPTION OF PREFERRED EMBODIMENTS

Figure 1:
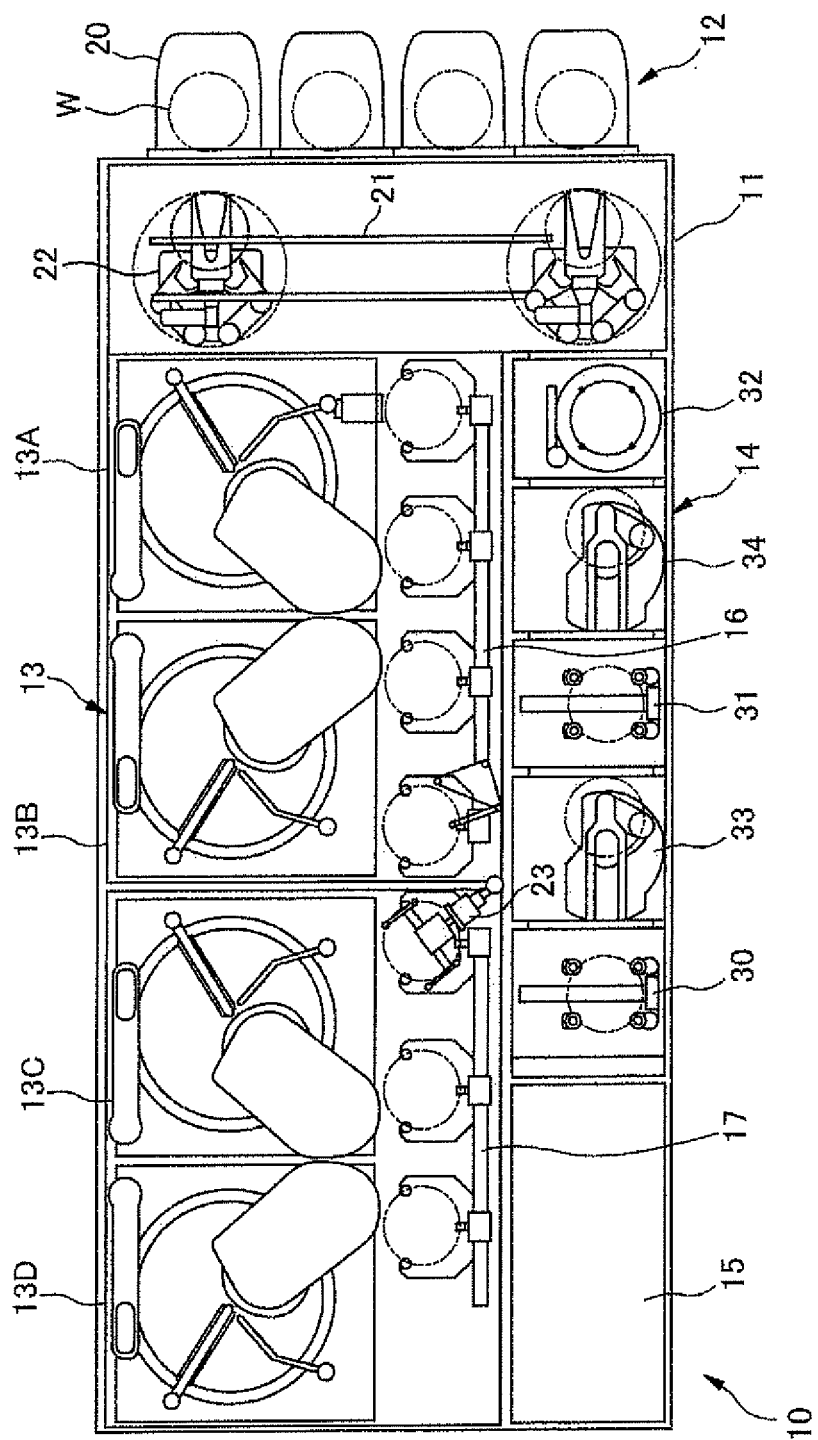
FIG. 1 is a plan view that schematically shows the configuration of a substrate processing apparatus according to an embodiment of the present invention.

A substrate processing apparatus according to an embodiment of the present invention will be described hereunder with reference to the drawings. The same or corresponding constituent elements are represented by the same reference numerals, and duplicative descriptions thereof are omitted.

FIG. 1 is a plan view showing the entire configuration of the substrate processing apparatus. The substrate processing apparatus 10 is compartmented into a load/unload unit 12, a polishing unit 13 and a cleaning unit 14. These units are mounted in a rectangular housing 11. The substrate processing apparatus has a control device 15 for controlling a substrate processing operation.

The load/unload unit 12 includes plural front load units 20, a traveling mechanism 21 and two carrying robots 22. A substrate cassette on which multiple substrates (substrates) are stocked is mounted in the front load unit 20. The carrying robots 22 have two hands on the upper and lower sides, and move on the traveling mechanism 21 to perform an operation of taking out a substrate W from the substrate cassette in each front load unit 20 and feeding the substrate W to the polishing unit 13, and also returning a processed substrate fed from the cleaning unit 14 to each substrate cassette.

The polishing unit 13 serves as a region where polishing (flattening treatment) is performed on substrates, and plural polishing units 13A to 13D are provided in the region so as to be arranged along the longitudinal direction of the substrate processing apparatus. Each polishing unit includes a top ring for polishing the substrate W on a polishing table while pressing the substrate W against a polishing pad, a polishing liquid supply nozzle for supplying polishing liquid or dressing liquid to the polishing pad, a dresser for dressing the polishing face of the polishing pad and an atomizer for spraying mixture fluid of liquid and gas or misty fluid to the polishing face to wash out polishing wastes and abrasive grains remaining on the polishing face.

First and second linear transporters 16 and 17 are provided as a transport mechanism for transporting the substrate W between the polishing unit 13 and the cleaning unit 14. The first linear transporter 16 is freely movable among a first position where the substrate W is received from the load/unload unit 12, second and third positions where the substrate W is delivered between the polishing units 13A and 13B, and a fourth position where the substrate W is delivered to the second linear transporter 17.

The second linear transporter 17 is freely movable among a fifth position where the substrate W is received from the first linear transporter 16, and sixth and seventh positions where the substrate W is delivered between the polishing units 13C and 13D. A swing transporter 23 for feeding the substrate W to the cleaning unit 14 is provided between the transporters 16 and 17.

The cleaning unit 14 includes a first substrate cleaning apparatus 30, a second substrate cleaning apparatus 31, a substrate drying device 32, and carrying robots 33 and 34 for delivering the substrate among these devices. The substrate W which has been subjected to a polishing treatment in the polishing unit is cleaned (primary-cleaning) in the first substrate cleaning apparatus 30, and then further cleaned (finish-cleaning) in the second substrate cleaning apparatus 31. The cleaned substrate is transported from the second substrate cleaning apparatus 31 into the substrate drying device 32 to be subjected to spin drying. The dried substrate W is returned to the load/unload unit 12.

Figure 2:
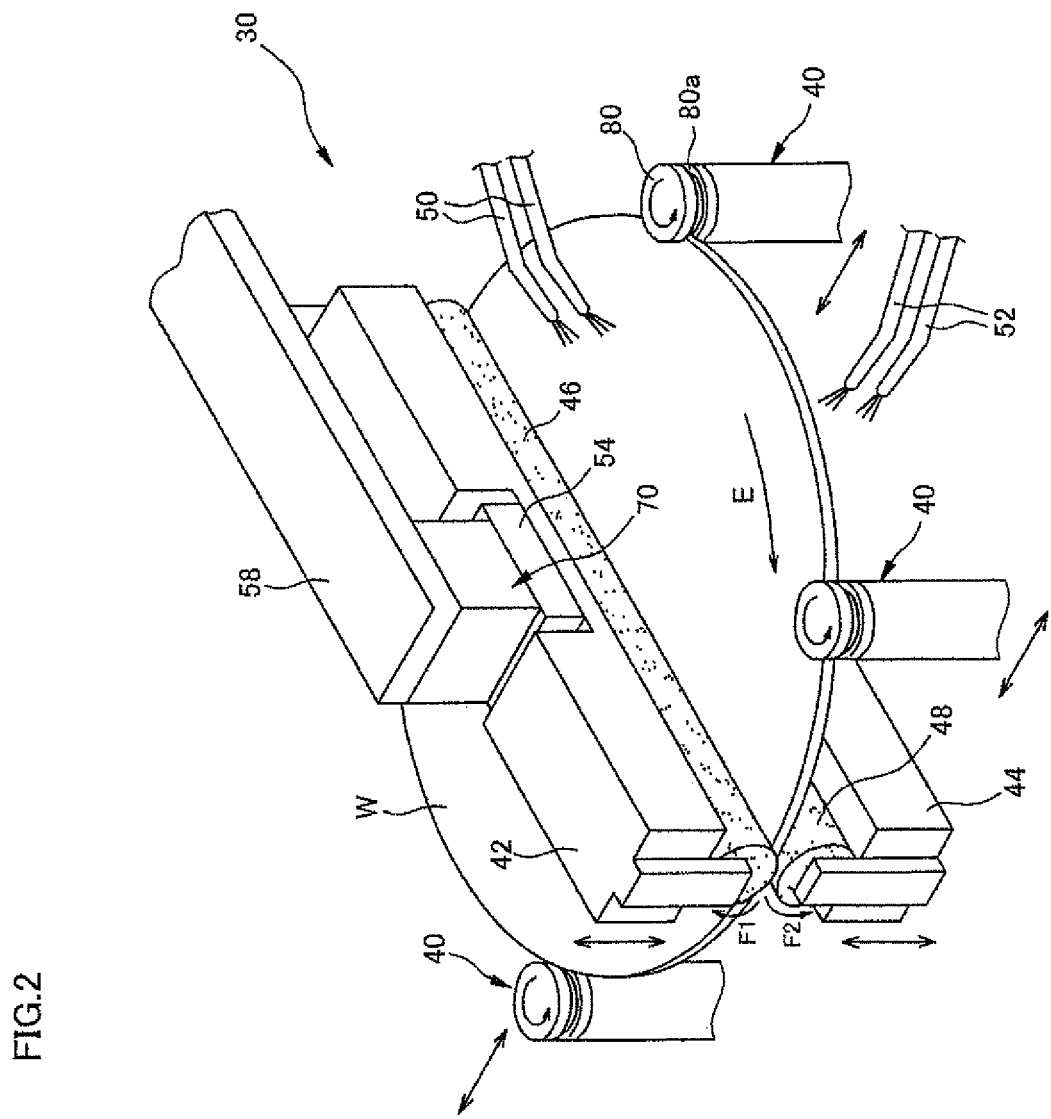
FIG. 2 is a perspective view that schematically shows an embodiment of a substrate cleaning apparatus.

FIG. 2 is a perspective view showing the configuration of the substrate cleaning apparatuses 30, 31 according to an embodiment of the present invention. The substrate cleaning apparatus 30 has plural (four in an example of FIG. 2) spindles 40 for rotating the substrate W in a horizontal direction while supporting the peripheral edge portion of the substrate W. As indicated by arrows of FIG. 2, these spindles 40 are movable in a direction parallel to the surface of the substrate W between a position where the spindles 40 are in contact with the peripheral edge portion of the substrate W and a position where the spindles 40 are evacuated from the substrate W. The substrate cleaning apparatus 30 has an upper roll arm 42 which is arranged above the substrate W so as to be freely movable up and down, and a lower roll arm 44 which is arranged below the substrate W so as to be freely movable up and down.

The spindle 40 is provided with a roller 80 at the upper portion thereof. An engaging groove 80a is formed on the outer peripheral surface of the roller 80, and the roller 80 is pressed against the substrate 8 while the peripheral edge portion of the substrate W abuts against the engaging groove 80a, thereby rotating the substrate W. As a result, the substrate W is horizontally rotated as indicated by an arrow F of FIG. 2. In the embodiment shown in FIG. 2, all the four rollers 80 are linked to a driving mechanism (not shown) to apply rotational force to the substrate W. Alternatively, two rollers 80 of the four rollers may be caused to apply the rotational force to the substrate W (the driving mechanism is not shown) while the other two rollers 80 are caused to function as bearings for receiving the rotation of the substrate W.

A cylindrical upper roll cleaning member (roll sponge) 46 extending horizontally is freely rotatably supported by the upper roll arm 42. The upper roll cleaning member 46 is formed of, for example, PVA (polyvinyl alcohol), and rotated in a direction indicated by an arrow F1 of FIG. 2 by a driving mechanism (not shown). A cylindrical lower roll cleaning member (roll sponge) 48 extending horizontally is freely rotatably supported by the lower roll arm 44. The lower roll cleaning member 48 is formed of, for example, PVA and rotated in a direction indicated by an arrow F2 of FIG. 2 by a driving mechanism (not shown).

Two upper supply nozzles 50 for supplying the front surface (upper surface) of the substrate W with chemical liquid and pure water (rinse liquid) are located and arranged above the substrate W which is rotated while supported by the spindles 40. Furthermore, two lower supply nozzles 52 for supplying the back surface (lower surface) of the substrate W with chemical liquid and pure water (rinse water) are located and arranged below the substrate W which is rotated while supported by the spindles 40.

The cleaning of the substrate W is performed as follows. Under the state that the substrate W is rotated horizontally, the upper roll cleaning member 46 is moved downwards while rotated, whereby the upper roll cleaning member 46 is brought into contact with the front surface of the rotating substrate W under a predetermined pressing load while the chemical liquid is supplied from the upper supply nozzle 50 onto the front surface (upper surface) of the substrate W. As a result, the front surface of the substrate W has been subjected to scrub-cleaning by the upper roll cleaning member 46 under the presence of the chemical liquid. The length of the upper roll cleaning member 46 is set to be slightly longer than the diameter of the substrate W, so that the overall front surface of the substrate W is cleaned at the same time.

Simultaneously with the cleaning of the front surface of the substrate W, the lower roll cleaning member 48 is moved upwards while being rotated, whereby the lower roll cleaning member 48 is brought into contact with the back surface of the rotating substrate W under a predetermined pressing load while the chemical liquid is supplied from the lower supply nozzle 52 to the back surface (lower surface) of the substrate W. As a result, the back surface of the substrate W has been subjected to scrub-cleaning by the lower roll cleaning member 48 under the presence of the chemical liquid. The length of the lower roll cleaning member 48 is set to be slightly longer than the diameter of the substrate W, so that the overall back surface of the substrate W is cleaned at the same time. After the front and back surfaces of the substrate W have been cleaned, pure water is supplied from the upper supply nozzle 50 and the lower supply nozzle 52 onto the front and back surfaces of the substrate N, thereby rinsing the substrate W with pure water.

Figure 3:
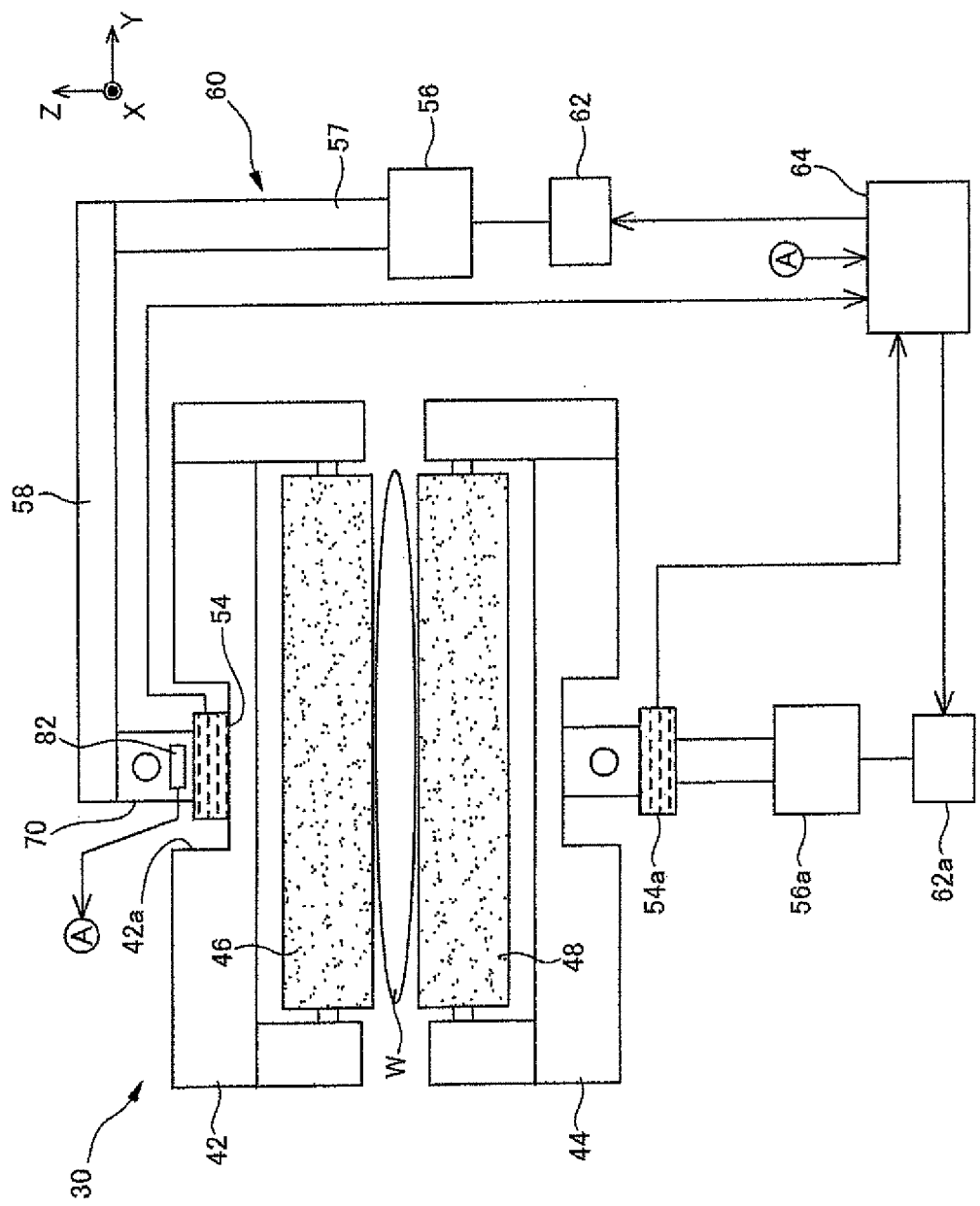
FIG. 3 is a front view that schematically shows the entire configuration of the substrate cleaning apparatus.

FIG. 3 is a diagram that schematically shows the overall configuration of the substrate cleaning apparatus. A concave portion 42a is formed at the center of the upper roll arm 42, and a load cell 54 located in the concave portion 42a is fixed to the upper roll arm 42. The upper roll arm 42 is linked to the elevating mechanism 60. The elevating mechanism 60 includes an air cylinder 56 as an actuator, an elevating shaft 57 which extends in a vertical direction and moves up and down in accordance with the driving of the air cylinder (actuator) 56, and a support arm 58 which is linked to the upper end of the elevating shaft 57 and extends in a horizontal direction. The upper roll arm 42 is linked to the support arm 58 through a tilt mechanism 70.

The upper roll arm 42 is moved up and down integrally with the elevating shaft 57 and the support arm 58 by the air cylinder 56. An electric pneumatic regulator 62 serving as a pressure adjuster for controlling the pressure of gas to be supplied into the air cylinder 56 is linked to the air cylinder 56.

When the substrate W is cleaned, the upper roll arm 42 moved downwards to bring the upper roll cleaning member 46 into contact with the substrate W. At this time, a tensile load applied to the load cell 54 decreases, and the decrease amount of the tensile load coincides with the pressing load applied to the substrate W by the upper roll cleaning member 46 as much as possible. The pressing load applied to the substrate W by the upper roll cleaning member 46, that as, the decrease amount of the tensile load as measured by the load cell 54.

Information on the measured value of the pressing load obtained by the load cell 54 is transmitted to a controller 64. The controller 64 compares the measured value of the pressing load with a set value of the pressing load, generates a control signal representing an operation amount of the electric pneumatic regulator 62 for minimizing the difference between the measured value and the set value (or reducing the difference to within a predetermined range), and transmits the control signal to the electric pneumatic regulator 62, thereby adjusting the pressing load applied onto the substrate W by the upper roll cleaning member 46.

Figure 4:
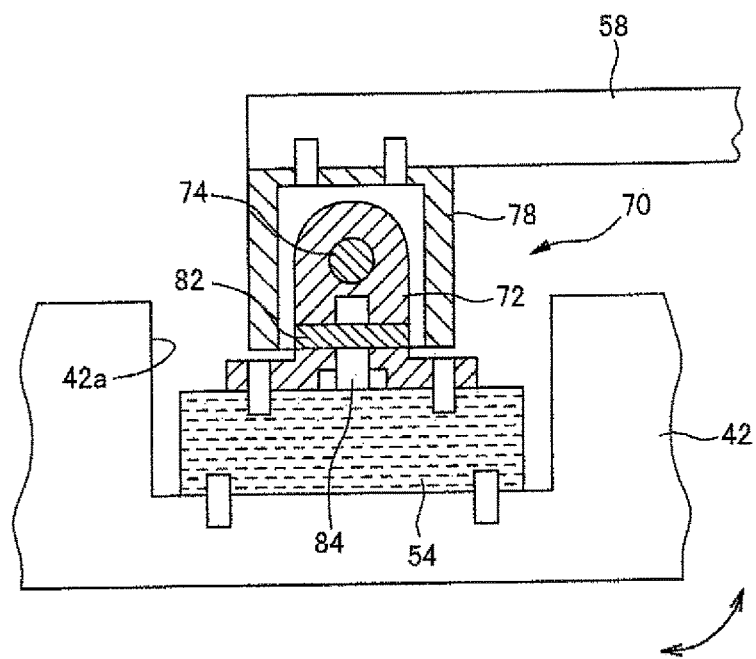
FIG. 4 is a cross-sectional view of a main part of the substrate cleaning apparatus.
Figure 5:
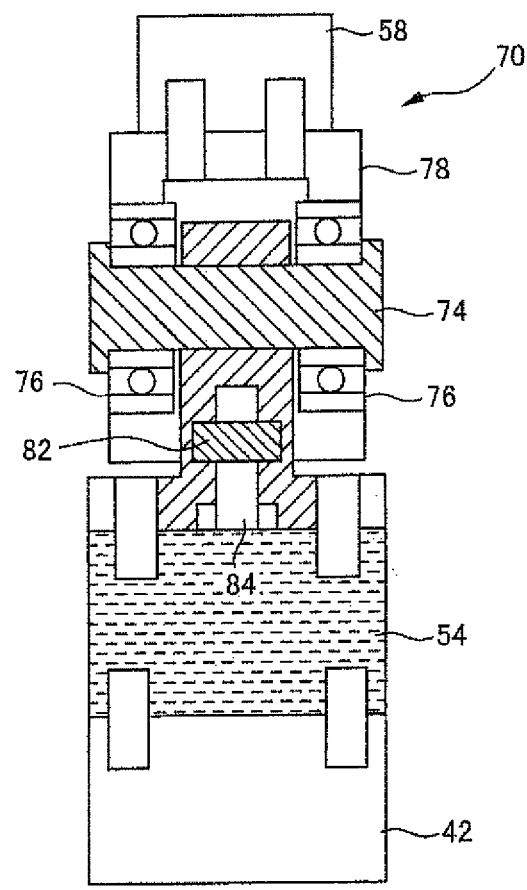
FIG. 5 is a cross-sectional view of a main part of the substrate cleaning apparatus.

The tilt mechanism 70 for tiltably supporting the upper roll arm 42 is installed between the load cell 54 and the free end of the support arm 58. As shown in FIGS. 4 and 5, the tilt mechanism 70 includes a bracket 72 fixed to the load cell 54, a bearing casing 78 linked to the support arm 58, and a pivot 74 through which the bracket 72 and the bearing casing 78 are freely rotatably linked to each other. A through-hole is formed in the bracket 72 so as to extend in a direction perpendicular to the extension direction of the upper roll arm 42, and the pivot 74 is inserted through the through-hole and fixed to the bracket 72. The bearing casing 78 to which a pair of bearings 76 for supporting the pivot 74 freely rotatably are fitted is linked to the free end of the support arm 58, thereby allowing the upper roll arm 42 fixed to the load cell 54 to tilt about the pivot 74 in a direction indicated by an arrow of FIG. 4.

Via the tilt mechanism 70 as described above, the support arm 58 supports the upper roll cleaning member 46 which is freely rotatably supported by the upper roll arm 42 so that the upper roll cleaning member 46 can be tilted. According to the configuration as described above, when a warp, a tilt, fluttering caused by rotation or the like occurs in the substrate W, the upper roll cleaning member 46 can follow the motion of the surface of the substrate W while kept in a horizontal posture. Accordingly, the upper roll cleaning member 46 can come into uniform contact with the substrate W over the entire length of the upper roll cleaning member 46. Since the pressing load is uniformly applied to the substrate W as described above, the substrate cleaning performance can be enhanced, and repulsive force from the substrate W can be received by the overall upper roll cleaning member 46 to enhance the measurement precision of the pressing load.

The elevation control mechanism of the roll arm using the load cell and the tilt mechanism of the roll arm described above are also provided below the substrate W, whereby the pressing load applied onto the substrate W by the lower roll cleaning member 48 can be controlled, and the tilt of the lower roll arm. 44 can be adjusted.

A sensor member 82 for detecting frictional force occurring between the upper roll cleaning member 46 and the substrate W is provided on the upper side of the upper roll cleaning member 46 of the substrate cleaning apparatus 30 and inside the bracket 72. For example, a strain sensor for detecting the force which the bracket 72 receives in an X-axis direction of FIG. 4 is used as the sensor member 82, and is fixed in a cavity formed inside the bracket 72 by a fixing member 84 such as a screw. The sensor member 82 is waterproofed by a coating member (not shown) or the like.

In the substrate processing apparatus 30 according to the embodiment, the upper roll cleaning member 46 is connected to the support arm 58 via the bracket 72 arranged at the center in the axial direction of the upper roll cleaning member 46, and torque caused by the frictional force between the substrate W rotating during cleaning processing and the upper roll cleaning member 46 concentrates in the bracket 72. Therefore, the sensor member 82 is mounted inside the bracket 72 to measure the torque received by the bracket 72, whereby the frictional force between the upper roll cleaning member 46 and the substrate W can be accurately measured.

The sensor member 82 is connected to the controller 64, and a signal representing the measured value of the frictional force at the sensor member 82 is transmitted to the controller 64. The control device 15 compares the measured value of the frictional force with a set value read out from a recording medium (not shown) or a set value which has been set in advance, and when the difference between the measured value and the set value is deviated from a predetermined range, the control device 15 transmits, to the electric pneumatic regulator 62, a control signal representing an operation amount of the electric pneumatic regulator 62 to minimize the difference. The electric pneumatic regulator 62 operates based on the control signal, and changes the driving force of the air cylinder 56 to change the positional relationship between the cleaning member and the substrate W. As a result, the frictional force between the upper roll cleaning member 46 and the substrate W is adjusted, so that dispersion in cleaning characteristic caused by variation of the frictional force can be suppressed.

In the foregoing embodiment, the pressing force by the upper roll cleaning member is adjusted based on the measurement signal representing the frictional force between the upper roll cleaning member and the substrate which is measured by the sensor member 82, thereby adjusting the frictional force between the upper roll cleaning member and the substrate. However, the present invention is not limited to this method, and the frictional force between the upper roll cleaning member and the substrate may be adjusted by adjusting the rotational speed of the roll cleaning member, for example.

In the foregoing embodiment, the sensor member 82 is arranged only on the upper side of the substrate W (that is, the upper roll cleaning member side). However, the present invention is not limited to this arrangement, and the sensor member may be arranged on the lower side of the substrate W (that is, the lower roll cleaning member side) or may be arranged on both of the upper and lower sides. As a result, the variation of the frictional force between the lower roll cleaning member 48 and the substrate W can be detected, and variation in cleaning characteristic can be suppressed.

Furthermore, in the foregoing embodiment, the frictional force is detected by measuring force occurring in one direction (X-axis direction of FIG. 3) parallel to the surface of the substrate W. However, the present invention is not limited to this method, and for example a triaxial sensor may be used. The pressing force onto the substrate W by the upper roll cleaning member 46 can be measured by detecting the force occurring in a direction (Z-direction of FIG. 3) vertical to the surface of the substrate W, and the variation of the pressing force onto the substrate W by the upper roll cleaning member 46 can be suppressed by adjusting the driving force of the air cylinder 56, so that the load cell 54 can be replaced by the sensor member 82.

Not only the frictional force between the upper roll cleaning member 46 and the substrate W, but also force occurring in the rotational direction (torsion component) of the substrate W during cleaning processing can be measured by measuring not only force occurring in the axis direction of FIG. 3, but also force occurring in the Y-axis direction. Accordingly, for example, when the force of the torsion component received by the substrate W exceeds a predetermined value, the substrate cleaning apparatus is determined to be abnormal, thereby preventing occurrence of trouble in the substrate cleaning apparatus before it happens.

Furthermore, the friction coefficient between the roll cleaning member and the substrate W during cleaning processing can be calculated from the measured value in the force in the X-axis direction (frictional force) of FIG. 3 and the measured value of the force in the Z-axis direction (normal force) of FIG. 3 in the sensor member. When the calculated friction coefficient is deviated from a predetermined range, abnormality such as deterioration of the roll cleaning member or the like may be detected to promote exchange of the roll cleaning member, whereby degradation of cleaning performance due to abnormality of the roll cleaning member can be prevented.

In the foregoing embodiment, the frictional force between the upper roll cleaning member 46 and the substrate W is detected to adjust the variation of the frictional force in the controller equipped to the substrate cleaning apparatus. However, the present invention is not limited to this manner. The frictional force between the upper roll cleaning member 46 and the substrate W may be detected to adjust the variation of the frictional force in the control device 15 for collectively controlling the operation of the substrate processing apparatus.

The foregoing embodiment is described so that those skilled in the art to which the present invention belongs can implement the present invention. Various modifications of the foregoing embodiment can be naturally made by those skilled in the art, and the technical concept of the present invention is applicable to other embodiments. For example, a substrate cleaning apparatus for cleaning the back surface of a substrate with a cleaning member in which a planar substrate is sucked and held with the back surface of the substrate facing downward, and cleaned by moving a cleaning member pressed against the back surface of the substrate may be provided with a sensor for measuring the frictional force between the cleaning member and the substrate so that the frictional force between the cleaning member and the substrate is controlled based on the measurement result of the sensor. Accordingly, the present invention is not limited to the embodiment described above, and it should be interpreted within the broadest range complying with the technical concept defined by Claims.

What is claimed is:
1. A substrate cleaning apparatus for bringing an elongated roll cleaning member into sliding contact with a flat plate type substrate to perform cleaning processing on the substrate, comprising:
   a roll holder for supporting the roll cleaning member so that the roll cleaning member is rotatable;
   an elevating mechanism that has a linking member for supporting the roll holder, and moves the roll holder up and down so that the roll cleaning member applies a predetermined roll load to the substrate;
   a sensor member that is provided to the linking member and measures frictional force between the roll cleaning member and the substrate; and
   a controller for performing feedback control on the frictional force between the roll cleaning member and the substrate based on a measured value of the sensor member,
   wherein the sensor member measures a roll load onto the substrate by the roll cleaning member, and the controller controls up-and-down movement of the roll holder based on the measured value of the roll load from the sensor member to feed back the roll load,
   wherein the controller calculates a friction coefficient between the roll cleaning member and the substrate based on the roll load and the frictional force which are measured by the sensor member, and detects abnormal- ity of the roll cleaning member when the calculated friction coefficient deviates from a predetermined range.

2. The substrate cleaning apparatus according to claim 1, wherein the sensor member is disposed inside the linking member.

3. The substrate cleaning apparatus according to claim 1, wherein the linking member is arranged substantially at the center along a longitudinal direction of the roll holder.

4. A substrate processing apparatus comprising a substrate polishing apparatus and further including the substrate cleaning apparatus according to claim 1.

5. A substrate processing apparatus including a substrate polishing apparatus for performing polishing processing on a flat plate type substrate, a substrate cleaning apparatus for cleaning the substrate after the polishing processing and a control device for controlling operations of the substrate polishing apparatus and the substrate cleaning apparatus, wherein the substrate cleaning apparatus includes:
   an elongated roll cleaning member that is brought into sliding contact with the substrate;
   a roll holder for supporting the roll cleaning member so that the roll cleaning member is rotatable;
   an elevating mechanism that has a linking member for supporting the roll holder, and moves the roll holder up and down so that the roll cleaning member applies a predetermined roll load to the substrate; and
   a sensor member that is provided to the linking member and measures frictional force between the roll cleaning member and the substrate and the roll load, wherein the control device performs feedback control on the frictional force between the roll cleaning member and the substrate based on a measured value of the sensor member,
   wherein the control device calculates a friction coefficient between the roll cleaning member and the substrate based on the roll load and the frictional force which are measured by the sensor member, and detects abnormality of the roll cleaning member when the calculated friction coefficient deviates from a predetermined range.

6. A substrate cleaning apparatus for bringing an elongated roll cleaning member into sliding contact with a flat plate type substrate to perform cleaning processing on the substrate, comprising:
   a roll holder for supporting the roll cleaning member so that the roll cleaning member is rotatable;
   an elevating mechanism that has a linking member for supporting the roll holder, and moves the roll holder up and down so that the roll cleaning member applies a predetermined roll load to the substrate;
   a sensor member that is provided to the linking member and measures a force onto the substrate by the roll cleaning member in a first direction that is in parallel to the substrate and perpendicular to the axis of the roll cleaning member; and
   a controller for performing feedback control on the force in the first direction based on a measured value of the sensor member.

7. The substrate cleaning apparatus according to claim 6, wherein the sensor member measures a force onto the substrate by the roll cleaning member in a second direction that is perpendicular to the substrate, and the controller controls up-and-down movement of the roll holder based on the measured value of the force in the second direction from the sensor member to feed back the roll load.

8. The substrate cleaning apparatus according to claim 6, further comprising a sensor configured to detect a force onto the substrate by the roll cleaning member in a third direction that is parallel to the substrate and perpendicular to the first direction.

* * * * *